United States Patent [19]

Le Thiec

[11] Patent Number: 5,168,223
[45] Date of Patent: Dec. 1, 1992

[54] HIGH SENSITIVITY SATURABLE CORE MAGNETIC FIELD SENSOR WITH SYMMETRICAL STRUCTURE

[76] Inventor: Philippe Le Thiec, 1, Boulevard Clémenceau, 38100 Grenoble, France

[21] Appl. No.: 738,982

[22] Filed: Aug. 1, 1991

[30] Foreign Application Priority Data

Aug. 2, 1990 [FR] France ............... 90 10089

[51] Int. Cl.[5] ............................ G01R 33/04
[52] U.S. Cl. ..................... 324/253; 324/254
[58] Field of Search ............... 324/253–255, 324/117 R; 33/361; 340/870.33

[56] References Cited

U.S. PATENT DOCUMENTS

| | | | |
|---|---|---|---|
| 2,565,799 | 8/1951 | Brattain | 324/253 X |
| 3,718,872 | 2/1973 | Takeuchi | 324/253 X |
| 3,919,630 | 11/1975 | Oshima et al. | 324/254 X |
| 3,971,981 | 7/1976 | Nakagome et al. | 324/254 |
| 4,068,164 | 1/1978 | Schwartz et al. | 324/253 X |
| 4,277,751 | 7/1981 | Lawson et al. | 33/361 X |
| 4,379,366 | 4/1983 | Kuno et al. | 33/361 |
| 4,495,467 | 1/1985 | Kuno et al. | 324/244 |
| 4,771,547 | 9/1988 | Akutsu et al. | 33/361 X |

FOREIGN PATENT DOCUMENTS 0045509 8/1981 European Pat. Off. .
2016662 4/1970 Fed. Rep. of Germany .

OTHER PUBLICATIONS

Russell et al., "Characteristics of the Capacitively Loaded Flux Gate Sensor", IEEE Transactions on Magnetics, vol. MAG-19, No. 2, Mar. 1983, pp. 126–130.

*Primary Examiner*—Gerard R. Strecker
*Attorney, Agent, or Firm*—Lowe, Price, Le Blanc & Becker

[57] ABSTRACT

A high sensitivity magnetic field sensor comprises a high permeability magnetic circuit (10) and excitation means ($L_e$) for periodically saturating the magnetic circuit. Two identical windings ($L_1$, $L_2$) are symmetrically wound around symmetrical parts (A, B) of the magnetic circuit. Identical first and second capacitors ($C_1$, $C_2$) are respectively connected to the terminals of the windings. The voltages on the windings determine the value of the magnetic field.

6 Claims, 10 Drawing Sheets

HIGH SENSITIVITY SATURABLE CORE MAGNETIC FIELD SENSOR WITH SYMMETRICAL STRUCTURE

BACKGROUND OF THE INVENTION

The present invention concerns magnetic field sensing devices, magnetometers or gradiometers.

Today, in magnetic field detection or magnetic mass detection, relatively precise and efficient high-sensitivity sensors exist, for example, nuclear magnetic resonance magnetometers or superconductor magnetometers operating in liquid helium.

One obvious disadvantage of this type of magnetometer is its very high cost. Furthermore, superconductor magnetometers have a limited lifespan (it is not possible to maintain the low temperatures required for superconductors for very long periods under normal operating conditions).

Thus, fluxgate magnetometers which have the advantage of a relatively low cost are frequently used. The structure and operation of fluxgate magnetometers are described in relation to FIG. 1. It must be remembered that directional or nondirectional magnetometers are frequently used to detect earth field variations linked to the presence or passage of metallic objects or magnetic field sources, which requires the use of many devices.

Figure 1:
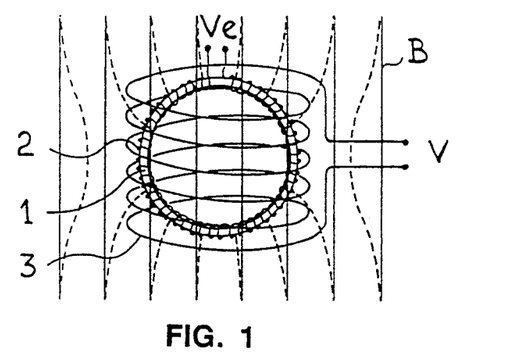
FIG. 1, which was described above, illustrates the operation of a conventional fluxgate magnetometer.

FIG. 1 is a pictorial representation of a fluxgate magnetometer to explain the operating principles. This type of magnetometer, which is designed to be put in a magnetic field B, includes a saturable magnetic core 1 of high magnetic permeability. A winding 2, fed by an a.c. voltage $V_e$, makes it possible to periodically bring the magnetic core into saturation.

When the magnetic core is saturated, magnetic field B is not substantially disturbed by the core, and the flux lines are, for example, straight as shown by the solid lines in FIG. 1. However, when the magnetic core is not saturated, the flux lines come closer together and tend to enter the magnetic core because of its high permeability. These flux lines are represented by the broken lines in FIG. 1.

A sense coil 3 placed near the core 1 which creates the disturbance in the magnetic field is a source of voltage V whose fundamental frequency corresponds to the excitation frequency. The voltage is characteristic of flux variations across winding 3 and thus is indirectly characteristic of the value of the field B in which the device is placed. In FIG. 1, the sense winding is represented as surrounding the saturable core 1. This is possible since the effect of opposite turns of the excitation winding 2 is cancelled. It should be noted, however, that the sense winding could be placed elsewhere in the field.

One disadvantage of such prior art magnetometers which have a relatively simple structure is their low sensitivity, no more than 100 microvolts/nT. This low sensitivity makes it necessary to use a long (high) sense coil with many turns. Thus, measurements of nonhomogeneous fields result in errors linked to the influence of the field gradient (nondiagonal terms of the gradient tensor).

It is therefore an object of the present invention to provide a simply structured, high-sensitivity magnetic field sensor.

Another object of the present invention is to provide a magnetometer whose accuracy will not be significantly disturbed by possible field gradients.

Still another object of the present invention is to provide a magnetic field sensor whose accuracy will not be significantly disturbed by temperature variations and aging.

A further object of the present invention is to provide a magnetic field sensor that provides information directly in a digital form.

A still further object of the present invention is to provide such a sensor, that can be used as a simply structured and highly sensitive gradiometer.

SUMMARY OF THE INVENTION

To reach these objects, the present invention provides a high sensitivity magnetic field sensor comprising a high permeability magnetic circuit; excitation means for periodically saturating the circuit; two identical windings, symmetrically wound around symmetrical parts of the magnetic circuit; identical first and second capacitors, respectively connected to the terminals of the first and second windings; and means for measuring the difference between the magnetic fluxes crossing the aforementioned parts.

In accordance with an embodiment of the present invention, the capacitance of the capacitors is chosen in relation to the value of the inductances of the windings and the periodicity of the excitation signal so that the two capacitors are charged by the voltage generated across the terminals of the windings during the desaturation phases of the magnetic circuit; so that the two resonant circuits formed by each assembly of one capacitor and one winding start free oscillations during the saturation phases of the magnetic circuit; and so that the commutations of the excitation signal take place during the free oscillations while the difference in voltages at the terminals of the windings is reversed with respect to the preceding commutation.

The windings are preferably concentrated near the equatorial plane of the saturable magnetic circuit.

In accordance with an embodiment of the present invention, measurement means comprise means for detecting a voltage generated by the flux difference; means for synchronous detection of the voltage, supplying a rectified signal; means for integrating the rectified signal; and means for reinjecting the rectified signal into the detection means.

The detection means are composed of the aforementioned windings or an auxillary winding surrounding the entire magnetic circuit.

The sensor has the following advantages: high sensitivity, high long-term stability, low intrinsic noise, low power consumption, directionality, simplicity of construction, an excellent cost-to-performance ratio, a wide bandwidth ranging from d.c. to a few kilohertz. In addition, as will be shown later, field information can be provided directly in a digital form.

BRIEF DESCRIPTION OF THE DRAWINGS

The aforementioned objects, characteristics, and advantages, as well as others, of the present invention will be explained in more detail in the following description of preferred embodiments with the annexed figures, wherein.

DESCRIPTION OF PREFERRED EMBODIMENTS

Structure and Operating Principles of the Sensor

Figures 2A, 2B, 2C:
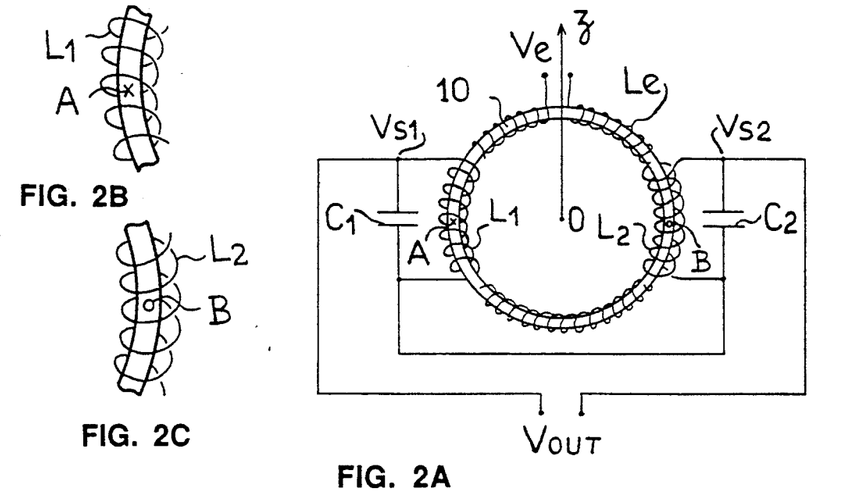
FIG. 2A is a schematic diagram of the detection element of a magnetometer according to the invention.
FIGS. 2B and 2C show parts of FIG. 2A on a larger scale.

FIG. 2A is a schematic diagram of a magnetic field sensor in accordance with the present invention. The sensor, with axis Oz, includes a highly permeable magnetic circuit 10, preferably closed, around which an excitation winding $L_e$ is wound. For purposes of simplification, winding $L_e$ is only partially represented in FIG. 2A. It is powered by a periodic excitation voltage $V_e$, whose amplitude is large enough to bring the magnetic circuit 10 into saturation at each period. Two parallel windings $L_1$ and $L_2$ are also wound around magnetic circuit 10. They are reversely connected with respect to the excitation flux. If the magnetic circuit is toroidal and presents a detection axis Oz as shown, the windings $L_1$ and $L_2$ will be wound around the toroid's diametrically opposed equatorial parts, A and B.

Each of the windings $L_1$, $L_2$ is connected to a capacitor $C_1$, $C_2$. The inductances $L_1$ and $L_2$ are identical, as are, preferably, the capacitors $C_1$ and $C_2$. A more detailed description of the value of the capacitors $C_1$ and $C_2$ will be given hereafter. $V_{s1}$ and $V_{s2}$ represent the voltages between the terminals of each resonant circuit, and $V_{out}$ is the difference between these voltages. The difference can be obtained by connecting a terminal from each of the capacitors $C_1$ and $C_2$ to each other and analyzing the difference in voltage between the other two terminals of the capacitors. $V_{out}$ can also be obtained between the two terminals of an extra detection winding, like winding 3 in FIG. 1.

Figure 3:
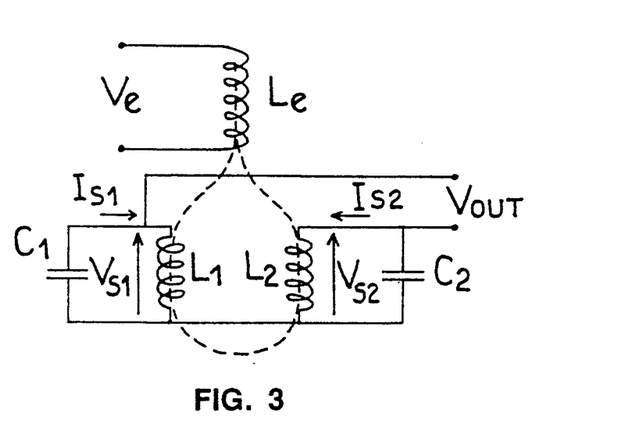
FIG. 3 is an equivalent circuit of the detector in FIG. 2.

In FIG. 3, the broken line represents the variable magnetic coupling between the windings $L_e$, $L_1$ and $L_2$. When the direction of the excitation voltage $V_e$ applied to the excitation winding $L_e$ is reversed, the saturation state of the magnetic core changes. When this happens, voltages $V_{s1}$ and $V_{s2}$ develop in windings $L_1$ and $L_2$. Since each of the inductances is connected to a capacitor, currents $I_{s1}$ and $I_{s2}$ will flow in each of the circuits $L_1C_1$ and $L_2C_2$.

The following section considers changes in the voltages and currents, both in the presence and absence of an external magnetic field, and for transient and steady state regimes.

1—Case of an External Magnetic Field Equal to Zero

In the absence of an external magnetic field, it is clear that the voltages and currents will be identical if both the inductances and capacitors are identical; windings $L_1$ and $L_2$ are connected in such a way that the voltage $V_{out}$ is equal to zero.

In this case, during a field inversion in the magnetic circuit, currents appear in the windings $L_1$ and $L_2$. These currents flow in such a direction that they oppose the field inversion. The two currents charge the capacitors $C_1$ and $C_2$, respectively. As soon as the magnetic circuit is saturated, the field variation in windings $L_1$ and $L_2$ stops. The circuits $L_1C_1$, $L_2C_2$ then become conventional inductance-capacitor resonant circuits, and the capacitors are charged and discharged in the inductances at the resonance frequency of the resonant circuit.

Figure 4A:
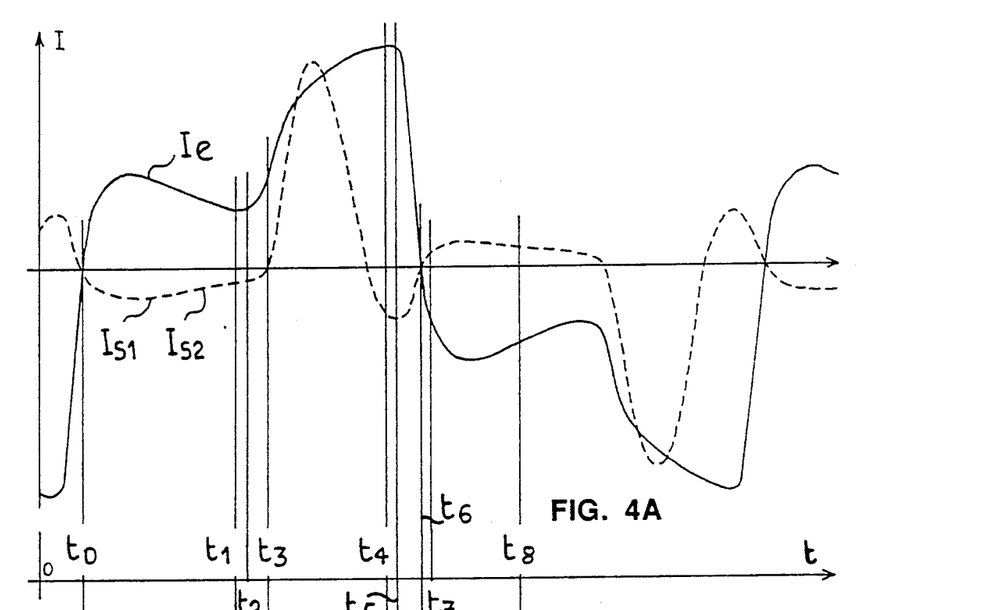
FIGS. 4A–4B, 7A–7B, and 10A–10B show examples of voltages and currents that may appear in a circuit according to the present invention: respectively, in the absence of a magnetic field, in the presence of a magnetic field in transient regime, and in the presence of a magnetic field in steady state.

The sensor's operation will be easier to understand with reference to FIGS. 4A to 6F. FIG. 4A presents a waveform diagram showing the current $I_e$ flowing in the excitation winding, and the current $I_s$ in the windings $L_1$ and $L_2$ ($I_s = I_{s1} = I_{s2}$). FIG. 4B depicts the aspect of the voltages, where $V_e$ is the voltage across the excitation winding when a rectangular control signal $V_{e0}$ is applied thereto, and $V_s = V_{s1} = V_{s2}$ is the voltage in the windings $L_1$ and $L_2$.

Figure 4B:
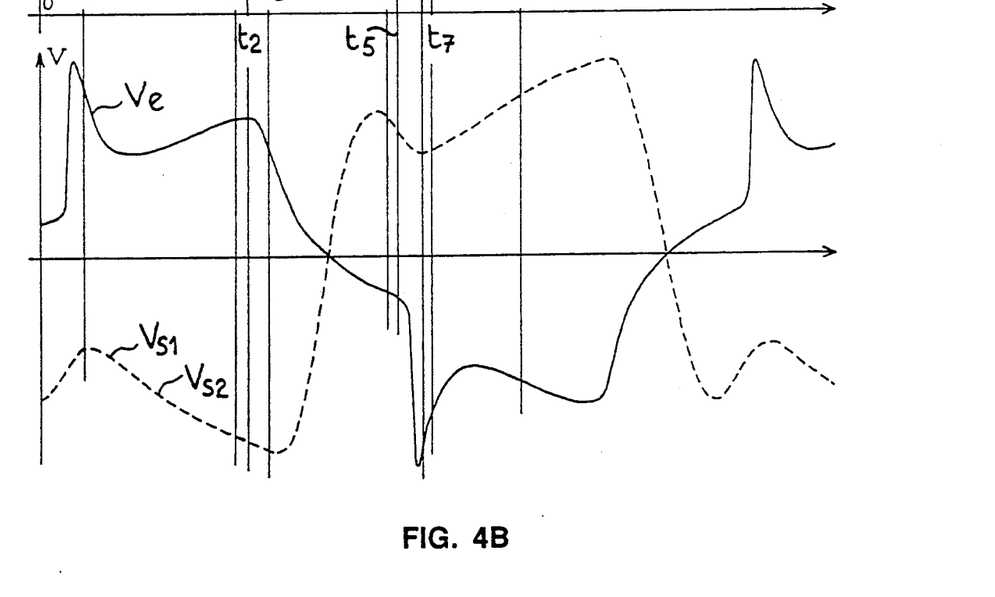
Figure 5:
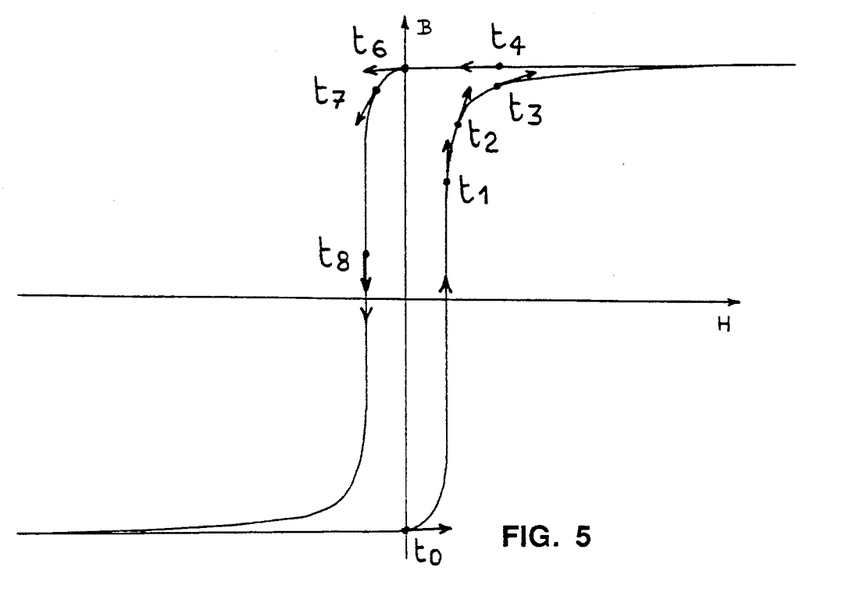
FIGS. 5, 8 and 11 illustrate the way diametrically opposed points of the magnetic core situated near the equatorial plane traverse the hysteresis loop in the cases represented by FIGS. 4, 7 and 10, respectively.
Figure 6A:
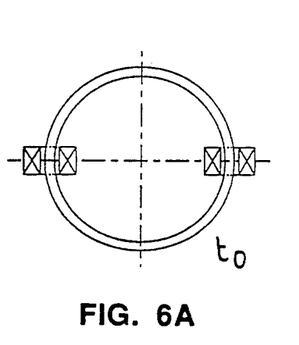
FIG. 6A–6F, 9A–9F, 12A–12H illustrate how the saturation of the magnetic core changes in the cases represented by FIGS. 4, 7 and 10, respectively.
Figure 6B:
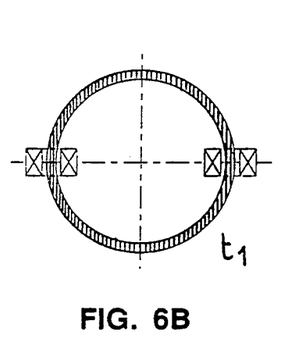
Figure 6C:
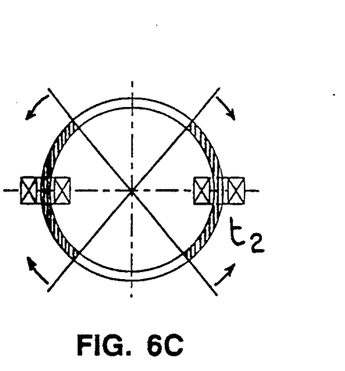
Figure 6D:
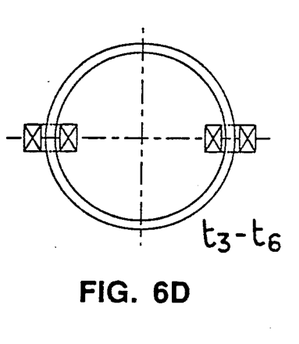
Figure 6E:
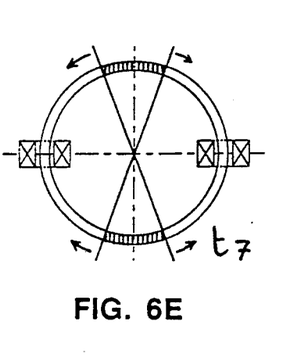
Figure 6F:
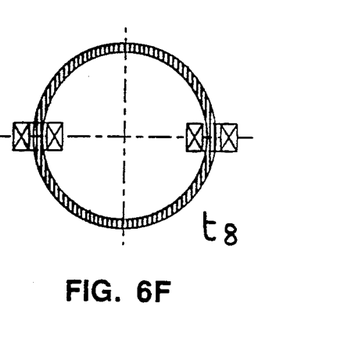
Figure 7A:
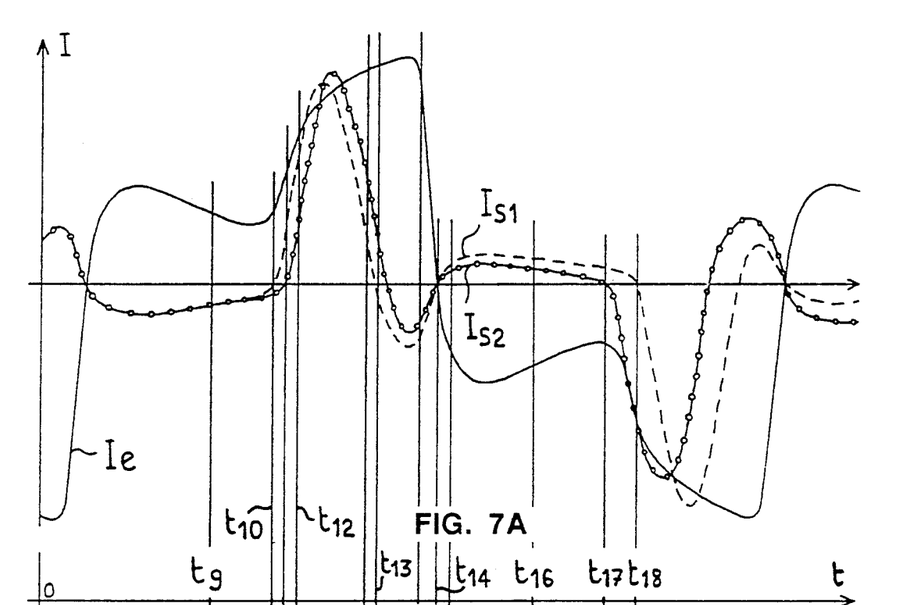
Figure 7B:
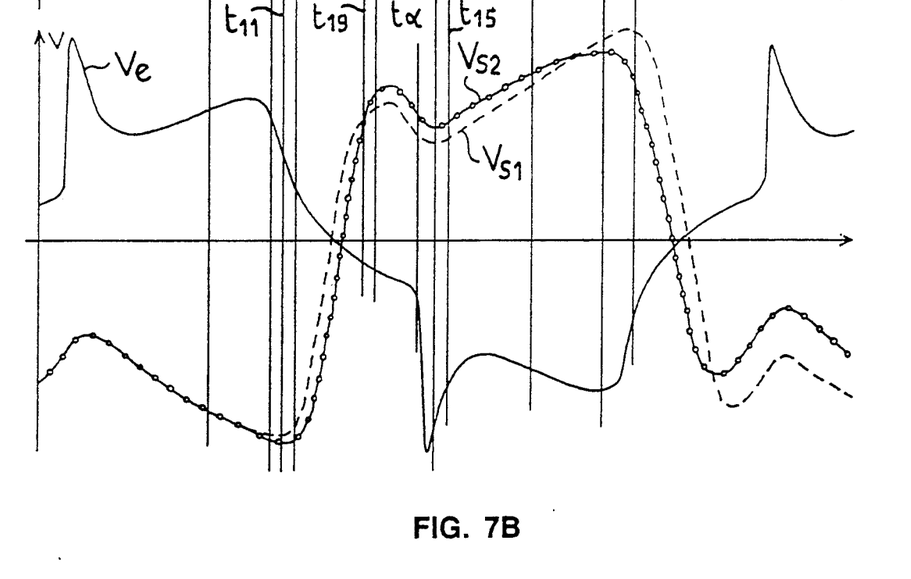

Times $t_0$ to $t_8$ to are shown in FIGS. 4A–4B, while the corresponding saturation states of the magnetic core are represented in FIG. 5 and in FIGS. 6A to 6F. FIG. 5 illustrates a hysteresis loop for a point inside the equatorial plane of the sensor, i.e. within one of the windings $L_1$ or $L_2$. FIGS. 6A to 6F show the magnetic state of the magnetic circuit 10. The non-saturated areas are hatched, and saturated areas are left blank.

Figure 8:
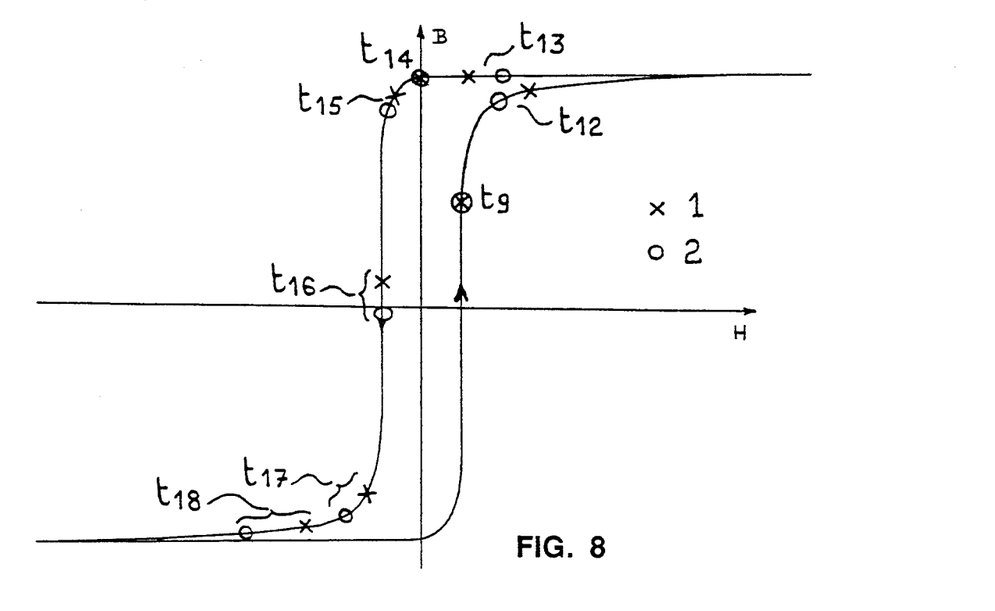
Figures 11, 12A, 12B, 12C, 12D:
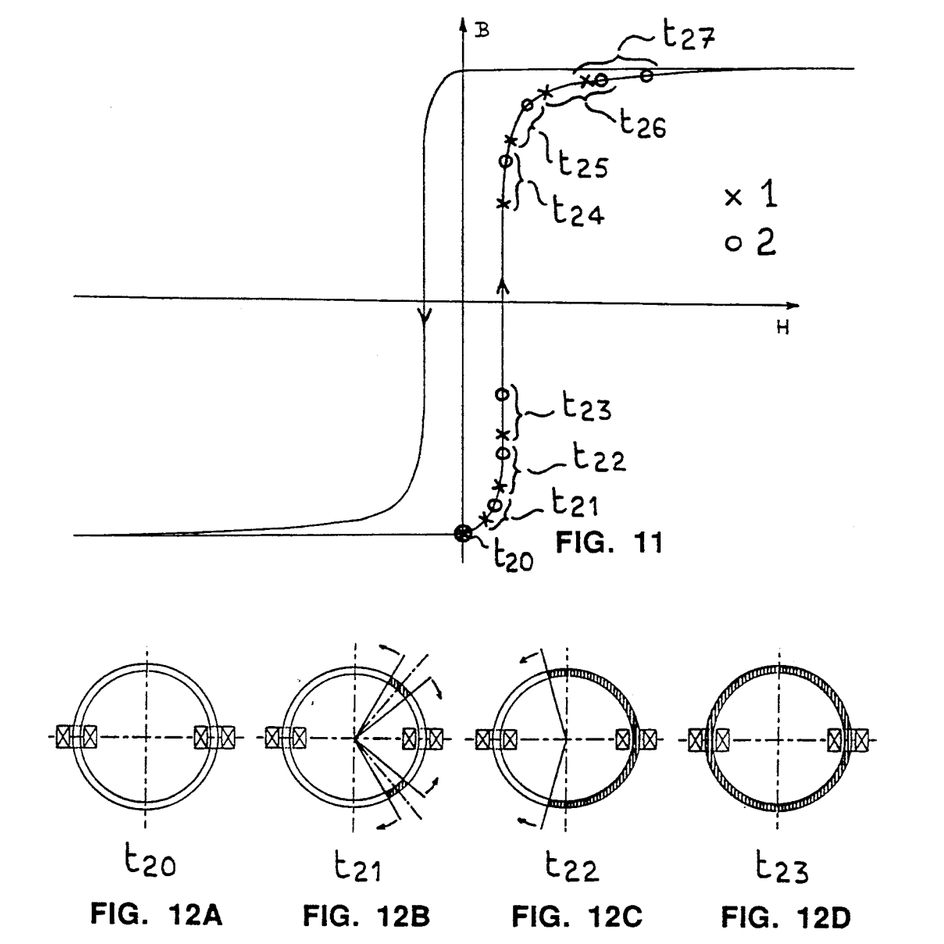
Figure 12E:
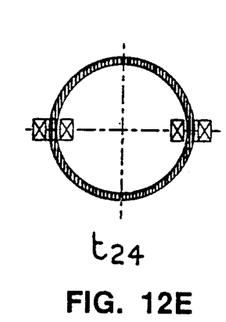
Figures 12F, 12G:
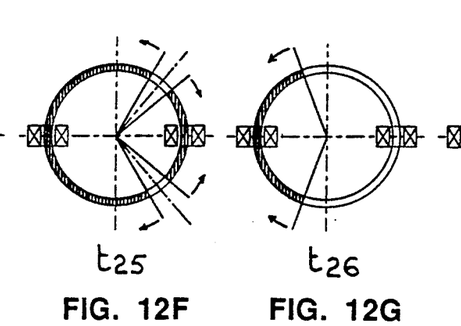
Figure 12H:
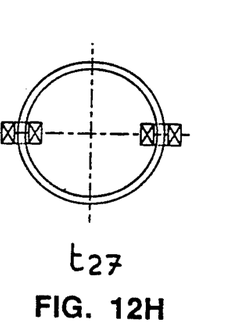

The hysteresis loop in FIG. 5 (and hysteresis loops in FIGS. 8 and 11) shows that the material is not saturated in the vertical parts of the hysteresis loop, while it is saturated in the horizontal parts. The corner in the first quadrant will be called the positive saturation corner; the corner in the second quadrant, the positive desaturation corner; the corner in the third quadrant, the negative saturation corner; and the corner in the fourth quadrant, the negative desaturation corner. It is assumed here that the hysteresis loop is run along in the conventional trigonometric orientation.

At $t_0$ (FIG. 6A), the entire magnetic circuit reaches the negative desaturation corner.

Between $t_0$ and $t_1$, both capacitors $C_1$ and $C_2$ are charged by the demagnetizing currents generated in the windings $L_1$ and $L_2$. The magnetic circuit is desaturated (FIG. 6B) during the entire quasi-vertical part of the hysteresis loop preceding $t_1$, and the field H is approximately equal to the coercive field strength $H_c$ of the magnetic material which is used. At this time, the magnetic coupling for all three windings $L_e$, $L_1$ and $L_2$ is maximum.

At $t_2$ (FIG. 6C), the magnetic circuit reaches the saturation corner, because the currents $I_{s1}$, $I_{s2}$ tend to oppose current $I_e$ less and less (this because $L_1C_1$ and $L_2C_2$ are oscillating circuits). The desaturated sector of the magnetic circuit decreases progressively as the demagnetizing field of coils $L_1$ and $L_2$ becomes weaker. At $t_2$, the polar areas of the magnetic circuit are already much more saturated than the equatorial points because the demagnetizing fields of the windings $L_1$ and $L_2$ are much weaker in the polar areas.

At $t_3$ (FIG. 6D), the entire magnetic circuit can be considered as saturated, and the value of the inductances $L_1$ and $L_2$ decreases considerably, causing the capacitors $C_1$ and $C_2$ to discharge. The fields created by the currents $I_{s1}$ and $I_{s2}$ are then added to the excitation field $H_e$, thereby saturating the material to a much greater degree than $H_e$ alone would have done. This is a distinct advantage for such a sensor. Due to the very strong periodic saturation, the material is completely demagnetized after it has been exposed, even accidentally, to a very strong field when the sensor is not powered. (This is the "memory" effect observed on some fluxgate sensors.)

If the excitation current $I_e$ was maintained high enough to keep the entire magnetic circuit saturated, then both circuits $L_1C_2$ and $L_2C_2$ would oscillate almost freely at their resonance frequency, following an exponentially potentially damped sinusoid.

FIGS. 4A and 4B show the beginning of this free oscillation between $t_3$ and $t_4$. When $I_{s1}$ and $I_{s2}$ are positive, fields $H_1$ and $H_2$ are created and added to the excitation field $H_e$.

If the reversal of the excitation voltage $V_e$ is started at $t_5$, then, shortly afterwards, at $t_6$, the magnetic core will approach the positive desaturation corner.

At $t_7$ (FIG. 6E), the polar areas are already desaturated, while the equatorial areas are still saturated because the demagnetizing currents $I_{s1}$ and $I_{s2}$ tend to delay the arrival of these areas in the desaturated zone.

From $t_8$ (FIG. 6F) onwards, the entire magnetic circuit is desaturated again, which considerably increases the magnetic coupling between $L_e$ and $L_1$ and between $L_e$ and $L_2$. Therefore, the demagnetizing currents $I_{s1}$ and $I_{s2}$ recharge the capacitors $C_1$ and $C_2$ with a polarity opposite the polarity at $t_0$.

From $t_6$ onwards, the situation is symmetrical to that described between $t_0$ and $t_6$.

2. Case of an External Magnetic Field Different From Zero 2.1 Transient Regime

At $t_9$, an external field $H_0$ different from zero is applied to the sensor (FIGS. 7A-7B, 8, 9A-9F). In the hysteresis loop in FIG. 8, as well as in the hysteresis loop in FIG. 11, a cross symbolizes a point A of the equatorial plane situated within winding $L_1$, and a circle symbolizes a point B of the equatorial plane situated within winding $L_2$.

Field $H_0$ is added to the excitation field $H_e$ on one of the windings $L_1$ and $L_2$, and is substracted from it on the other winding. Consequently, the part of the magnetic circuit corresponding to one of the windings $L_1$ and $L_2$ will reach saturation before the other part. Therefore, one of the two resonant circuits will switch from the capacitor charge phase to the oscillation phase before the other circuit.

It is assumed that the first circuit to enter the oscillation phase (at $t_{10}$) is $L_1C_1$, and that circuit $L_2C_2$ enters the oscillation phase at $t_{11}$.

As capacitor $C_1$ was charged for a shorter time than $C_2$, the amplitudes of the free oscillation voltage and current are smaller for $C_1$ than for $C_2$.

If the circuit was left on its own while the excitation current $I_e$ was maintained high enough to keep the entire magnetic core saturated, then both circuits $L_1C_1$ and $L_2C_2$ would oscillate almost freely at their resonance frequency, and both currents would follow two slightly out of phase, exponentially damped sinusoids. If, at the beginning of the free oscillations of circuit $L_1C_1$, the difference of currents is $\delta_1 I(t_{10}) = I_{s1}(t_{10}) - I_{s2}(t_{10})$ the difference of voltage is $\delta_1 V(t_{10}) = V_{s1}(t_{10}) - V_{s2}(t_{10})$, then these differences will alternately increase and decrease.

The voltage difference is indicative of the applied external field, and the correct choice of the commutation time, $t\alpha$, is fundamental for obtaining a maximum integrated voltage difference.

If the excitation voltage $V_{e0}$ is reversed at $t\alpha$ when:
$\delta_1 V(t\alpha)$ is inverted with respect to $\delta_1 V(t_{10})$, and
$\delta_1 V(t\alpha)$ has been amplified with respect to $\delta_1 V(t_{10})$,
then, shortly afterwards, at $t_{14}$, the diametrically opposed equatorial points of the magnetic circuit enter the positive desaturation corner with a difference in charge voltage between the two capacitors $C_1$ and $C_2$ that is greater, in absolute value, than it was at the beginning of the free oscillations, and has an inverted polarity.

At $t_{15}$, the windings $L_1$ and $L_2$ are subject to roughly the same excitation flux variations $-d\phi_e/dt$, but the voltages which will make it possible to recharge the capacitors $C_1$ and $C_2$ are different: on circuit $L_1C_1$, the voltage is $V_1(t_{15}) - d\phi_e/dt$ and on circuit $L_2C_2$, it is $V_2(t_{15}) - d\phi_e/dt$. As a consequence, the charge current of $C_1$, which had the lower voltage at $t_{14}$, will be higher than the charge current of $C_2$.

At $t_{17}$, current $I_{s2}$ is no longer strong enough to oppose the saturation of point B which is controlled by the excitation current, and circuit $L_2C_2$ starts its free oscillation. $I_{s2}$ then increases very quickly, creating a strong flux variation at point A, thereby inducing a high voltage on $L_1$ and tending to charge $C_1$ until $t_{18}$.

At $t_{18}$, point A becomes saturated under the combined effects of the excitation current and current $I_{s2}$. The inductance value of $L_1$ decreases very quickly, and $L_1C_1$ starts its free oscillation.

It should be noted that, if the conditions for $t\alpha$ are met, the difference $t_{18} - t_{17}$ is greater than $t_{11} - t_{10}$.

Figure 9A:
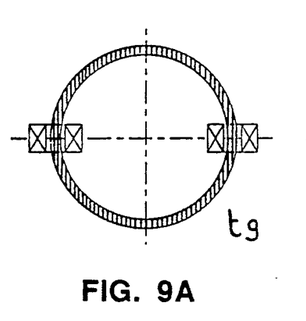
Figure 9B:
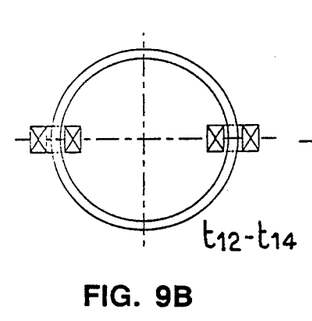
Figure 9C:
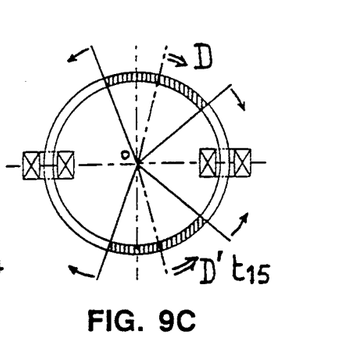
Figure 9D:
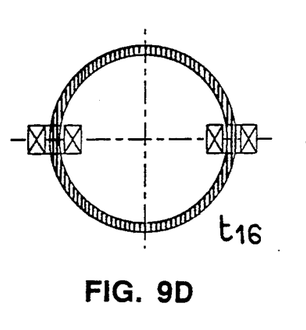
Figure 9E:
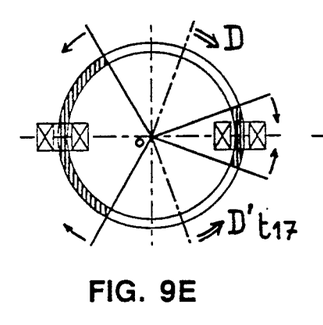
Figure 9F:
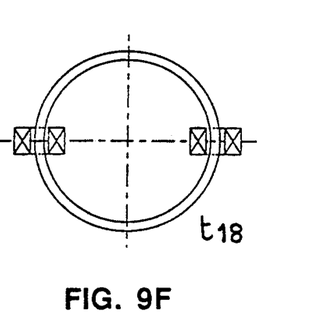

During the next half period, the same phenomena take place. They tend to amplify to a greater and greater degree the differences in the voltages and currents between the two circuits $L_iC_i$ and to narrow the angular sector DOD' (represented by double arrows at $t_{15}$ and $t_{17}$ in FIGS. 9C and 9E).

Therefore, two different phenomena tend to amplify the sensor's dissymmetry generated by the applied external field $H_0$ at $t_9$:

1) Amplification of the difference in charge voltage between $C_1$ and $C_2$ during the free oscillations (pumping phenomenon); and 2) Amplification of the amplitude and phase difference between the charge currents of $C_1$ and $C_2$ during the phases when the magnetic core is desaturated.

The amplification mentioned in 1) takes place when the magnetic material is fully saturated; it benefits from an extremely low intrinsic noise because the saturated material doesn't generate any more Barkhausen noise.

The correct synchronisation of the positive and negative excitation current pulses with the reversals of the charge voltages of the capacitors $C_1$ and $C_2$ ensures the amplification of the difference in the charge voltages and the difference in phases of the charges. The amplification factor that can be obtained with this system depends essentially on the phases between the excitation current and the two charge voltages of the capacitors. This factor can be adjusted from one (if, for example, the excitation control signal is reversed at $t_{19}$) to an extremely high value (if the voltage difference is allowed to increase). Optimum tuning depends on the stability of the oscillator which controls the excitation: the more stable its frequency and its duty cycle, the greater the amplification with this process. For this purpose, a quartz oscillator (frequency stability), followed by a frequency divider (duty cycle stability), are used.

The amplification mentioned in 2) has two major advantages.

First, it is achieved essentially around the saturation and desaturation corners of the magnetic circuit. At these two corners, magnetic polarization is such that magnetization mechanisms are essentially due to rotations of the spin magnetic momentums, not to displacements of Bloch walls which generate Barkhausen jumps.

Secondly, the noise generated by the ferromagnetic material is not amplified, as is the case on conventional fluxgate sensors. On the contrary, the energy from the noise is integrated during the entire phase when the hysteresis loop is traversed (between $t_0$ and $t_3$ in FIG. 4, for example). Obviously, this tends to increase the signal to noise ratio. (The average value of this noise can be considered as equal to zero, and its frequency can be considered as higher than the excitation frequency.) Consequently, this second kind of amplification also takes place under conditions when the generated noise is extremely low.

It is clear from these two remarks that the specific magnetic polarization of the sensor according to the invention, ensures the optimal use of a given magnetic core, from the point of view of the signal to noise ratio. Thus, even when medium quality magnetic material is used, charge voltage differences between the two capacitors of one volt per nanotesla of external field can easily be reached with coils $L_1$ and $L_2$ including about one hundred turns each.

2.2 Steady State

In steady state, the voltage difference $\delta_1 V(t)$ will stabilize after a given number of periods if the sensor is subject to the same conditions (same oscillations of the excitation current $I_e$ and same external field $H_0$). Therefore a not fully bistable device is obtained.

FIGS. 10A-10B, 11, and 12A-12H illustrate in a more detailed way how points A and B of the magnetic circuit reach desaturation (from $t_{14}$ to $t_{18}$ on FIG. 7).

They represent what follows FIGS. 7A-7B, 8 and 9A-9F when the same field $H_0$ is applied to the sensor and enough periods have elapsed to amplify sufficiently the current difference and voltage difference between circuits $L_1C_1$ and $L_2C_2$. The number of periods is very low in practice. Let $t_{20}$ be the time when all the currents are approximately equal to zero and the sum of the ampereturns present around the magnetic circuit is equal to zero. At this time, the charge voltage of $C_1$ is lower in absolute value than the charge voltage of $C_2$. Then, the excitation current tends to reverse the magnetic circuit magnetization.

At $t_{21}$, two small areas appear along the magnetic circuit where the magnetic material begins to desaturate. These areas are not situated at the poles of the sensor, because currents $I_{s1}$ and $I_{s2}$ are different and break the sensor symmetry. As $I_{s1}$ is higher than $I_{s2}$, it tends to maintain side 1 in saturation for a longer time than $I_{s2}$ maintains side 2.

These two desaturated areas progressively spread along the magnetic circuit.

At $t_{22}$, point B is desaturated, and point A is still saturated.

At this time, magnetic coupling between the excitation winding $L_e$ and winding $L_2$ is total. As this coupling is much stronger than on side 1, only the $L_2$ demagnetizing ampere-turns tend to oppose the magnetizing ampere-turns of the excitation circuit. Thus, the difference between currents $I_{s1}$ and $I_{s2}$ no longer tends to increase.

From $t_{23}$ until $t_{24}$, the entire magnetic circuit is desaturated. At $t_{24}$, the capacitors $C_1$ and $C_2$ are recharged, and their charge currents are no longer strong enough to oppose the arrival at positive saturation.

Shortly afterwards, at $t_{25}$, two areas appear where the magnetic circuit is saturated first. Again, as $I_{s1}$ and $I_{s2}$ are different, these areas do not appear at the detector poles. They appear on side 2 because $I_{s2}$ is weaker than $I_{s1}$, and thus $I_{s2}$ opposes less excitation current $I_e$ which tends to bring the circuit into positive saturation.

Thus, the magnetic coupling between $L_e$ and $L_1$ is still very strong while it is weak between $L_e$ and $L_2$. This tends to maintain side 1 in desaturation for a slightly longer time and, thus, to amplify the phase difference between the beginning of the oscillations of the two circuits $L_1C_1$ and $L_2C_2$.

Then, at $t_{26}$, for example, the saturated sector is lengthened and allows $L_2C_2$ to begin free oscillations. Current $I_{e2}$ then increases very rapidly and creates a strong field on side 1. This field is added to field $H_e$, which tends to saturate the point A area and accelerate the transition of $L_1C_1$ to the free oscillation phase. This phenomenon tends to reduce the phase difference between the beginning of the free oscillations of the two circuits $L_1C_1$ and $L_2C_2$ since the transition of one of the two circuits to free oscillations tends to favor the transition of the other circuit to the free oscillation phase.

At $t_{27}$, the magnetic circuit is totally saturated, and both circuits are oscillating freely.

In summary, the difference between the magnetic coupling of $L_e$ and $L_1$, and the magnetic coupling of $L_e$ and $L_2$, which contributed to the amplification of the difference in currents when this difference was small, allows it to stabilize when it becomes large.

Through the amplification and stabilization phenomena, the detector's response is linearized around a zero $H_0$ field. Thus, its use inside a field feedback loop is possible.

Information Output Circuitry

Figure 10A:
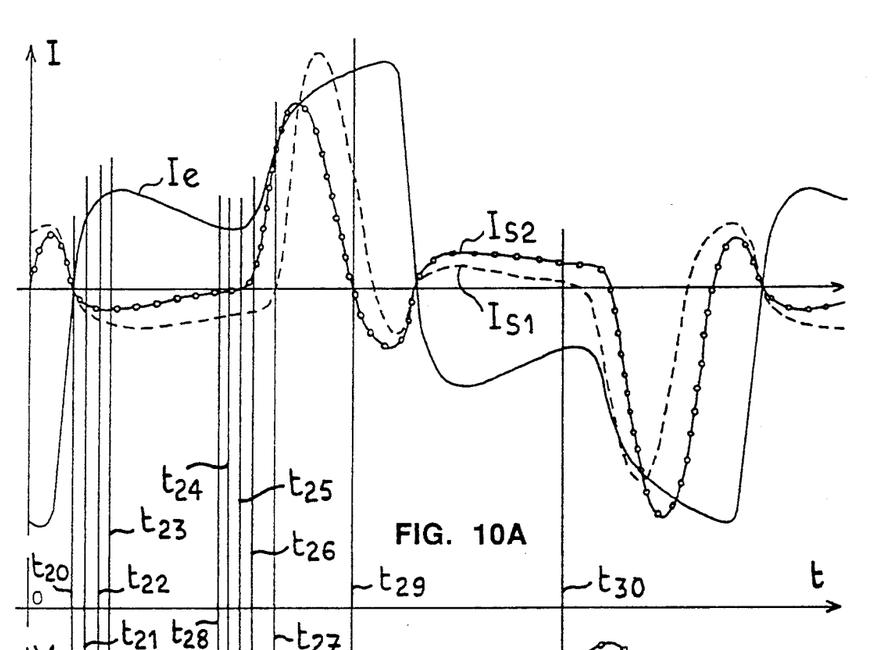
Figure 10B:
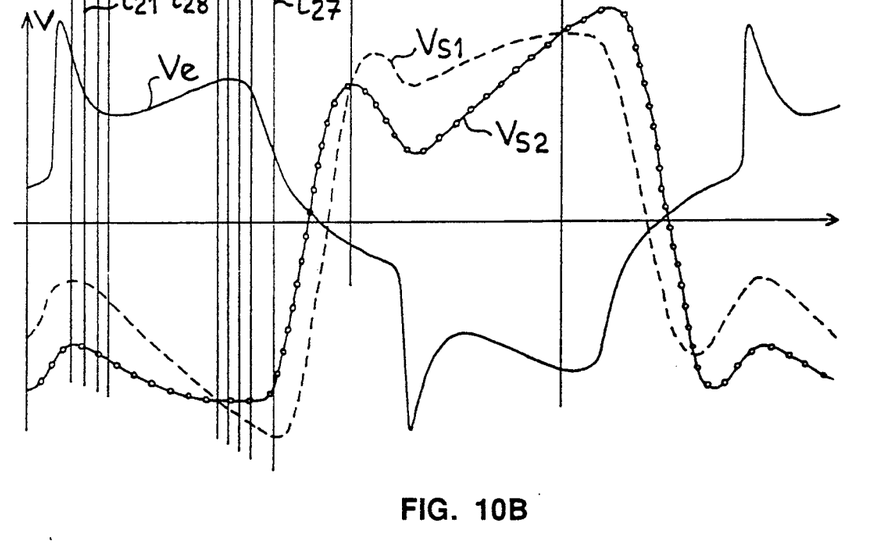

The information on the difference between voltages $V_{s1}$ and $V_{s2}$ of the sensor according to the present invention can be used in a wide variety of ways which remain the choice of the user. One way to use the difference consists in integrating the rectified value of the difference over a period. This will provide a signal that is directly proportional to the field applied to the sensor. As can be seen in FIG. 10B, the difference in, voltages $V_{s1}$, $V_{s2}$ is equal to zero at $t_{28}$, becomes negative, and then becomes positive between $t_{29}$ and $t_{30}$. The time lag between $t_{28}$, $t_{29}$ and $t_{30}$ and the origin $t_{20}$ is quasi-constant and quasi-independent of the magnetic field strength.

Figure 13:
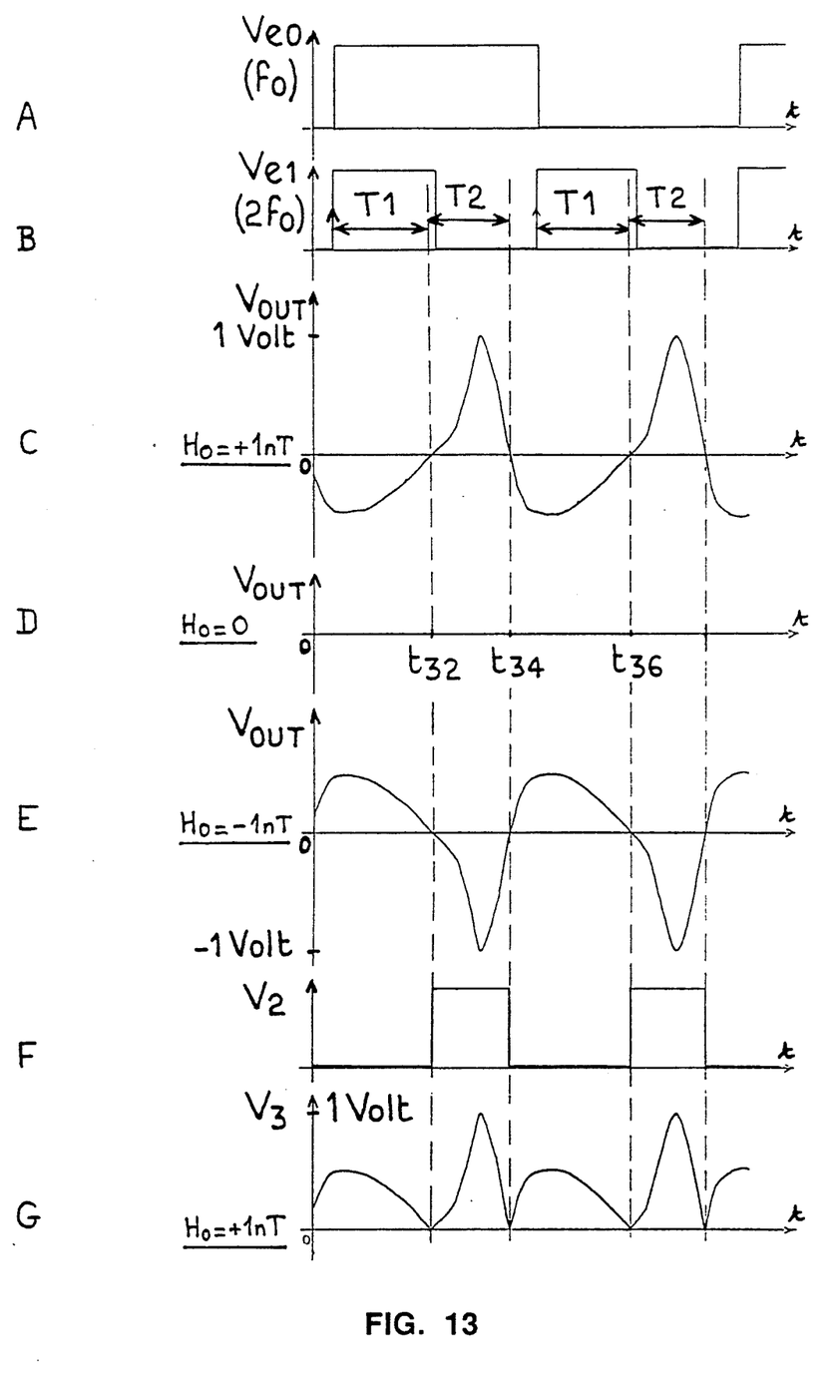
FIG. 13 shows various signal waveforms of a circuit according to the invention.

Section A of FIG. 13 shows the control signal of the excitation winding, $V_{e0}$; section B shows a double frequency signal, $V_{e1}$; section C shows the aspect of signal $V_{out}$ for a positive detected field with a value on the order of 1 nT; section D shows the aspect of the signal in the absence of an applied field; and section E shows the aspect of the signal for an applied field in a sense opposite that of C. To rectify the signal corresponding to the one illustrated in C, a signal such as the one shown in FIG. 13 F can be used. It must be taken into account that the time lags between $t_{34}$ and $t_{36}$, a and $t_{36}$ are practically constant. The waveform in FIG. 13 F shows rectangular pulses of a first polarity between $t_{32}$ and $t_{34}$, and of a second polarity between $t_{34}$ and $t_{36}$. By obtaining signal $V_{out}$, which is noninverted between $t_{32}$ and $t_{34}$ and inverted between $t_{34}$ and $t_{36}$, a detection signal like the one illustrated in FIG. 13 section G is obtained. The average value of the signal gives an indication of the value of the field to be measured $H_0$.

Figure 14:
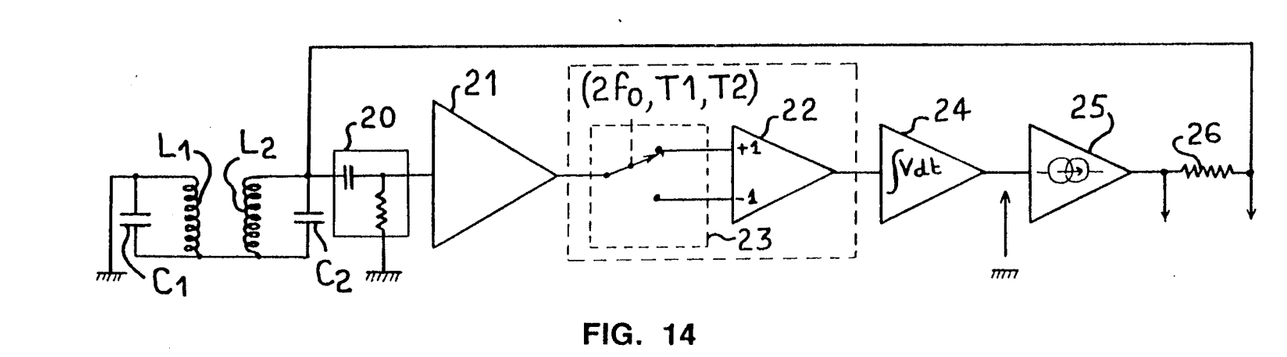
FIG. 14 shows a detector according to the invention associated with an analog measuring circuit.

This result can be obtained with the circuit illustrated in FIG. 14. The lower terminals of the capacitors $C_1$ and $C_2$ of the resonant circuits $L_1C_1$ and $L_2C_2$ are connected to each other. The upper terminal of capacitor $C_1$ is grounded, and the upper terminal of capacitor $C_2$ gives the detection signal which is applied via a filtering circuit 20 to an impedance matching amplifier 21. The output of amplifier 21 is applied to the inverted or noninverted input terminal of an amplifier 22 with the commutation carried out by a commutator 23 which is actuated in synchronism with the rectangular pulses illustrated in FIG. 13 F. The output of amplifier 22 is integrated in an integrator 24 and applied to a current amplifier 25 whose output is sent back to the connection point of inductance $L_2$ and capacitor $C_2$ as a feedback current. The value of the field applied to the detector can be obtained by reading the voltage at the terminals of a resistance 26 connected to the output of the current amplifier 25.

Figure 16:
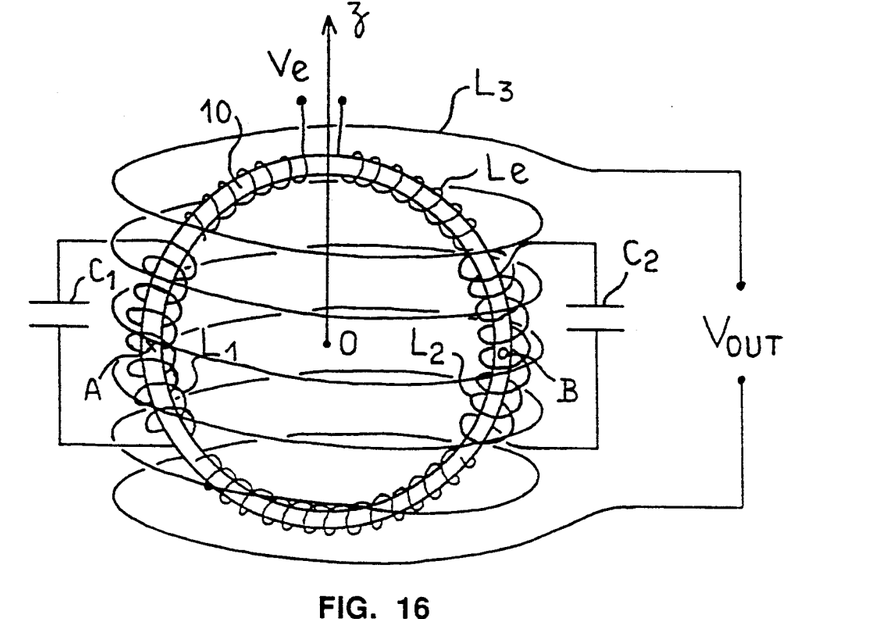
FIG. 16 shows a variation of the sensor according to the invention with an auxiliary coil.

It should be noted that detection and current feedback could be made elsewhere than on windings $L_2$, $L_1$. It could also be made on an auxiliary coil as illustrated in FIG. 16. In addition to the two windings $L_1$ and $L_2$ which would then be connected only to their respective capacitors $C_1$ and $C_2$, a third coil $L_3$ surrounding the magnetic circuit would be the only one connected to the detection and feedback electronic circuitry.

Figure 15:
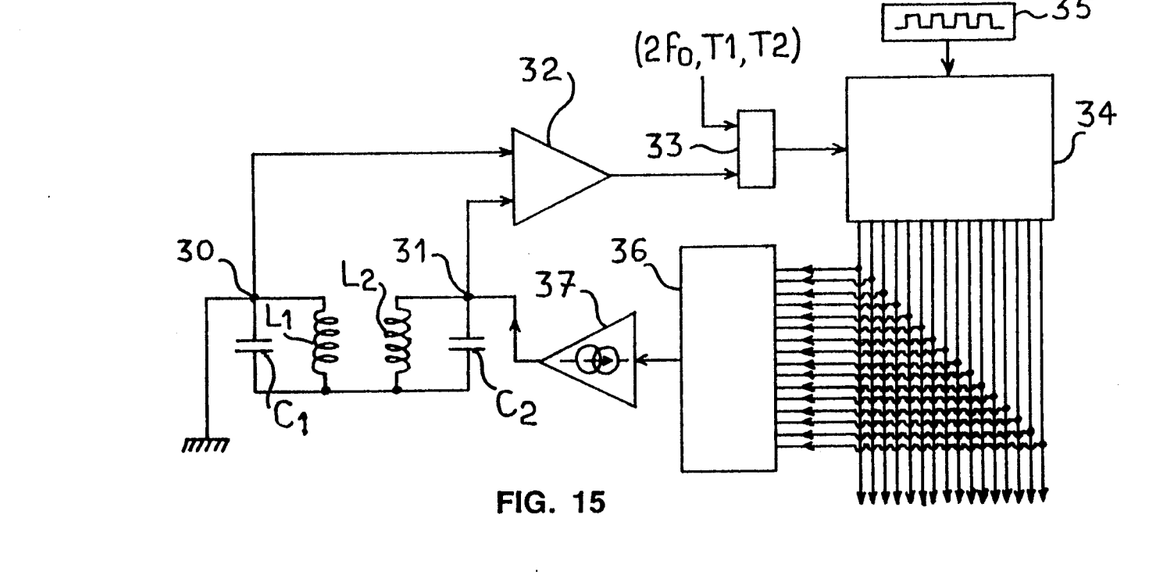
FIG. 15 shows a detector according to the invention associated with a digital measuring circuit.

The circuit in FIG. 15 illustrates a way of digitally measuring the field. Sensor outputs 30 and 31 are connected to the inputs of a voltage comparator 32 with a threshold of zero whose output ($\pm 1$ in binary code) is applied to one of the two inputs of an Exclusive OR gate 33. The other input of gate 33 is controlled by the rectangular pulses illustrated in FIG. 13F. The logic output of gate 33 is applied to the up/down input of counter 34 which is triggered by a clock 35. Counter 34 outputs provide binary information corresponding to the average value of field $H_0$. The outputs are connected, via a digital-to-analog voltage converter 36, to a current amplifier 37 that provides feedback on windings $L_1$, $L_2$.

It should be noted that the two types of setups described hereinbefore can be used simultaneously on the same sensor, for example with the digital detection/feedback circuit in FIG. 15 for a coarse measurement of field $H_0$ and with the analog circuit in FIG. 14 for a fine measurement of field $H_0$.

Hereinbefore, a magnetic field sensor and measurement systems were described in general and in relation to specific embodiments. Design details will be apparent from the foregoing explanations. Moreover numerous variations and modifications could be brought about by those skilled in the art.

For the magnetic core, for example, a U-shaped, toroidal support can be made of amagnetic stainless steel to hold a winding of Mumetal sheets with a relative permeability of 100,000. However, one known disadvantage of such a material is that Mumetal is sensitive to magnetostriction, and its relative permeability may vary widely. In addition, eddy current losses appear in stainless steel. Thus, it would be preferable to use an amorphous magnetic material which has a very low magnetostriction and whose dilation coefficient is approximately zero. These characteristics make it possible to use the material on an insulating support. The set of ribbons making up the magnetic core has, for example, a cross section of $0.2 \times 0.08$ mm.

Although the magnetic circuit was described as toroidal, rectangular magnetic circuits with rounded corners or with multiple branches could also be used. The shape of the circuit and its associated excitation and detection windings can be chosen to encourage a wide variation in the magnetic coupling coefficients between the windings, to improve the directional character of the detector, or to reduce even more its sensitivity to a magnetic gradient.

In a specific embodiment, the excitation winding has been regularly wound around the entire circumference of the magnetic toroid.

In addition, the number of turns on the excitation winding depends on the available excitation current $I_e$ and the diameter of the magnetic circuit toroid. It can be on the order of 2000 turns for a toroid a few centimeters in diameter.

The number of turns of the detection windings is determined so that a sufficiently strong signal is obtained while the resistance remains weak. Thus the damping of the oscillating circuit composed of each of the detection windings and its associated capacitor is weak. The two sectors of the magnetic circuit toroid on which the windings $L_1$ and $L_2$ are wound could correspond to an angle of 60° each. Approximately 100 turns could be used, with values for the capacitors on the order of 100 nanofarads.

The excitation frequency of the circuit could be of about 50 kilohertz obtained by division from a standard quartz crystal at a frequency of a few MHz. It should be noted that the use of a quartz crystal is particularly desirable for setting the excitation frequency because the precision of the device depends on the fact that the commutations always take place at the same time with respect to the resonant circuit oscillations.

Furthermore, one advantage of the present invention lies in the symmetry of the various electric circuits. Therefore, if all the elements undergo the same variations and thermal or aging drifts, the effect of the drifts on operations is nil, especially for the capacitors and inductances.

Figure 17:
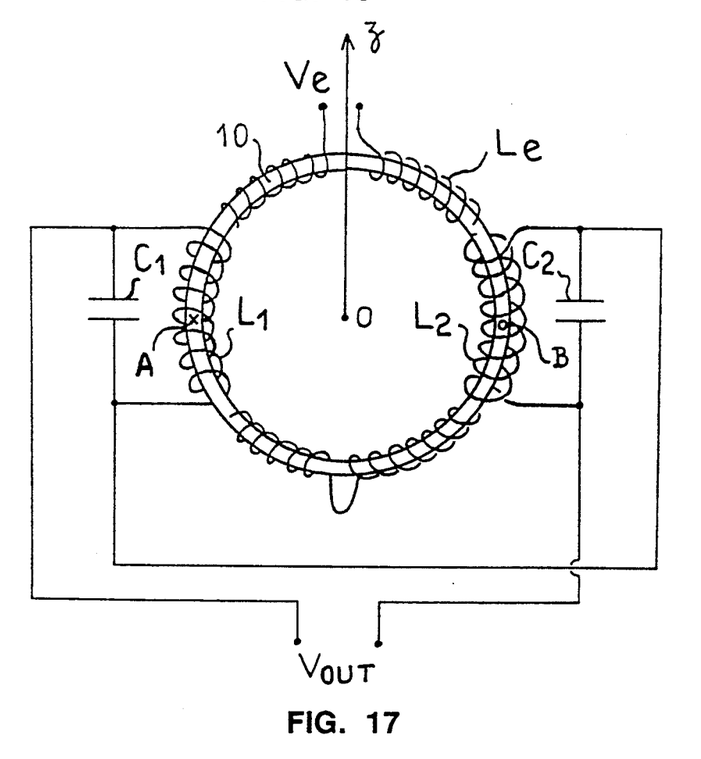
FIG. 17 shows a variation of the sensor according to the invention that can be used as a gradiometer.

The differential structure and high sensitivity of this detector allow for the construction of a gradiometer as illustrated in FIG. 17 using the foregoing principles and operation. The excitation winding $L_e$ is simply divided into two equal parts along the detector's axis. The winding direction is then reversed on half of the coil to create parallel excitation fields (and not opposite fields as for the magnetometer detector) at points A and B of the magnetic circuit. Or a circuit like circuit 3 in FIG. 1 is used as an excitation circuit and the connections of the circuits $L_1C_1$ and $L_2C_2$ reversed so that the sum of the excitation fluxes and the fluxes due to the homogeneous component of the external field Ho enclosed by $L_1$ and $L_2$ is cancelled at all times. Consequently, the detector is sensitive only to the difference between the external fields Ho between point A and point B, i.e. the magnetic gradient.

I claim:

1. A high sensitivity magnetic field sensor comprising:

a high permeability magnetic circuit including a closed-type magnetic core, excitation means wound around said magnetic core for periodically saturating said magnetic circuit, two identical windings symmetrically wound around symmetrical parts of said magnetic circuit, each of said parts being crossed by corresponding magnetic fluxes, identical first and second capacitors, respectively connected to the terminals of said first and second windings, and means responsive to the corresponding magnetic fluxes for measuring the difference between the magnetic fluxes crossing said parts;

wherein the capacitance of the capacitors is chosen in relation to the value of the inductances of said windings and the periodicity of the excitation signal, so that the two capacitors are charged by the voltage generated across the terminals of the windings during desaturation phases of the magnetic circuit, so that the two resonant circuits formed by each assembly of one capacitor and one winding start free oscillations during the saturation phase of the magnetic circuit, and so that the commutations of the excitation signal take place during the free oscillations while the difference in voltages at the terminals of the windings is reversed with respect to the preceding commutation.

2. A magnetic field sensor according to claim 1, wherein said windings are concentrated near a plane of symmetry of said magnetic circuit.

3. A magnetic field sensor according to claim 1, wherein said means for measuring comprise detection means for detecting a voltage generated by said flux difference, means for synchronous detection of this voltage, supplying a rectified signal, means for integrating the rectified signal, and means for reinjecting the rectified signal in said detection means.

4. A magnetic field sensor according to claim 3, wherein said detection means are composed of said windings .

5. A magnetic field sensor according to claim 3, wherein said detection means are composed of an auxiliary winding surrounding the entire magnetic circuit.

6. A magnetic field sensor according to claim 1, wherein said excitation means apply parallel and same direction fields to said symmetrical parts, whereby the sensor is operable as a gradiometer.

* * * * *